United States Patent
Hsu

(10) Patent No.: US 8,784,564 B2
(45) Date of Patent: Jul. 22, 2014

(54) FILM COATING APPARATUS

(75) Inventor: Chia-Ling Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 674 days.

(21) Appl. No.: 12/894,121

(22) Filed: Sep. 29, 2010

(65) Prior Publication Data

US 2011/0315082 A1 Dec. 29, 2011

(30) Foreign Application Priority Data

Jun. 29, 2010 (TW) ................................ 99121339 A

(51) Int. Cl.
C23C 16/00 (2006.01)
C23C 16/455 (2006.01)
C23C 16/46 (2006.01)
C23C 16/02 (2006.01)

(52) U.S. Cl.
CPC ........... C23C 16/45555 (2013.01); C23C 16/46 (2013.01); *C23C 16/45525* (2013.01); *C23C 16/0209* (2013.01)
USPC ............................ 118/725; 118/715; 118/724

(58) Field of Classification Search
CPC ...... C23C 14/541; C23C 16/44; C23C 16/46; C23C 16/45555; C23C 16/0209; C23C 16/0218; C23C 16/45525
USPC ............................ 118/715, 724, 725, DIG. 11
See application file for complete search history.

(56) References Cited

U.S. PATENT DOCUMENTS

| | | | | |
|---|---|---|---|---|
| 2,409,693 A * | 10/1946 | Okress | ......................... | 315/5.31 |
| 3,651,240 A * | 3/1972 | Kirkpatrick | ................ | 219/78.02 |
| 3,687,704 A * | 8/1972 | Stanley et al. | .................. | 27/481 |
| 3,687,706 A * | 8/1972 | Stanley et al. | .................. | 27/184 |
| 3,787,236 A * | 1/1974 | Bourdeau | ...................... | 428/389 |
| 4,423,700 A * | 1/1984 | Nguyen et al. | ................ | 118/404 |
| 4,699,083 A * | 10/1987 | Huet et al. | .................... | 118/719 |
| 4,911,638 A * | 3/1990 | Bayne et al. | .................. | 432/152 |
| 4,914,276 A * | 4/1990 | Blair | ............................. | 219/390 |
| 5,128,515 A * | 7/1992 | Tanaka | .......................... | 219/390 |
| 5,130,601 A * | 7/1992 | Walker et al. | .................... | 313/15 |
| 5,308,955 A * | 5/1994 | Watanabe | ...................... | 219/390 |
| 5,318,633 A * | 6/1994 | Yamamoto et al. | ........... | 118/725 |
| 5,603,772 A * | 2/1997 | Ide | .................................. | 118/724 |
| 5,616,024 A * | 4/1997 | Nobori et al. | ................. | 432/241 |
| 5,641,420 A * | 6/1997 | Peterson et al. | ............. | 219/536 |
| 5,763,856 A * | 6/1998 | Ohkase | ......................... | 219/390 |
| 5,882,412 A * | 3/1999 | Blaugher | ....................... | 118/718 |
| 6,496,648 B1 * | 12/2002 | Mack et al. | .................... | 392/416 |
| 6,741,804 B2 * | 5/2004 | Mack et al. | .................... | 392/416 |
| 6,759,805 B2 * | 7/2004 | de Cort et al. | ................ | 313/578 |

(Continued)

FOREIGN PATENT DOCUMENTS

JP 64-73078 A 3/1989
KR 10-2005-0067490 A 7/2005

*Primary Examiner* — Jeffrie R Lund
(74) *Attorney, Agent, or Firm* — Novak Druce Connolly Bove + Quigg LLP

(57) ABSTRACT

A film coating apparatus for coating a patterned roller using an atomic layer deposition process includes a deposition chamber and a heater. The deposition chamber defines an inlet and an outlet. The inlet is misaligned with the outlet. The heater is received in the deposition chamber. The heater includes a number of coiled filaments each formed into a generally circular loop. The filaments are spaced from each other and surrounds the patterned roller. The filaments are configured for heating the patterned roller.

5 Claims, 2 Drawing Sheets

(56) References Cited

U.S. PATENT DOCUMENTS

| | | |
|---|---|---|
| 6,763,686 B2 * | 7/2004 | Carpenter et al. ............... 65/413 |
| 7,223,447 B2 * | 5/2007 | Brown et al. ................. 427/543 |
| 7,563,725 B2 * | 7/2009 | Morad ........................... 438/758 |
| 8,375,891 B2 * | 2/2013 | Nagata et al. ........... 118/723 VE |
| 8,501,599 B2 * | 8/2013 | Ueno et al. .................... 438/509 |
| 8,580,037 B2 * | 11/2013 | Morad ........................... 118/730 |
| 2002/0150684 A1 | 10/2002 | Jayatissa |
| 2004/0056584 A1 * | 3/2004 | Gerard de Cort et al. .... 313/493 |
| 2005/0001531 A1 * | 1/2005 | Mineta et al. ................. 313/344 |
| 2005/0068519 A1 | 3/2005 | O'Meara et al. |
| 2009/0255471 A1 * | 10/2009 | Morad ........................... 118/730 |
| 2011/0315082 A1 * | 12/2011 | Hsu ............................... 118/725 |
| 2012/0177824 A1 * | 7/2012 | Gross ........................ 427/255.28 |

\* cited by examiner

FILM COATING APPARATUS

BACKGROUND

1. Technical Field

The present disclosure relates to film coating apparatuses.

2. Description of Related Art

In a roll-to-roll process, a patterned roller is used for patterning a roll of flexible foil. The patterned roller typically includes a stainless steel roller and a patterned copper layer formed on the stainless steel roller. However, the copper layer is relatively soft and can be scratched by any dust contaminating the copper layer or anything that comes into contact with the copper layer. Furthermore, the copper layer is easily oxidized in the air.

Therefore, a film coating apparatus for forming a protective film on the patterned roller, which can overcome the above-mentioned problems, is needed.

DETAILED DESCRIPTION

Figure 1:
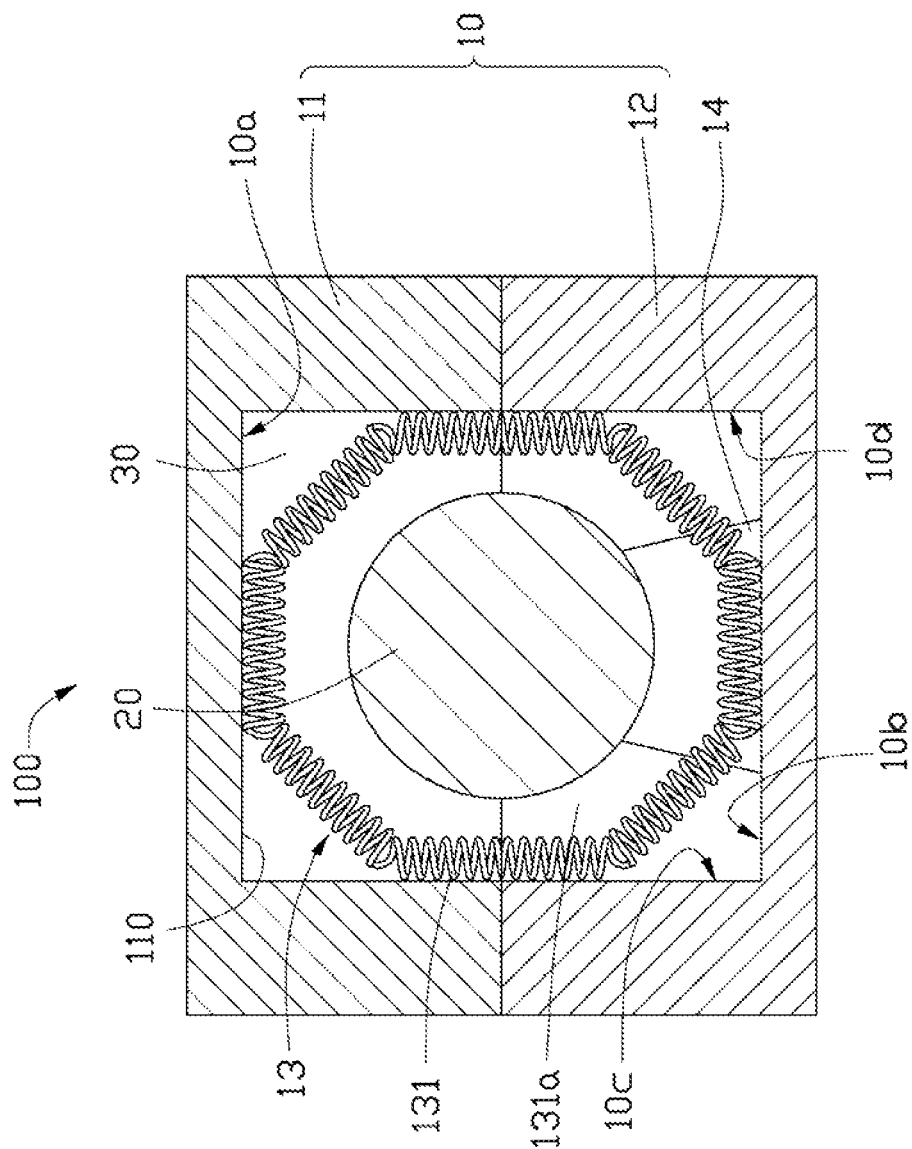
FIG. 1 is a sectional view of a film coating apparatus, according to an exemplary embodiment.
Figure 2:
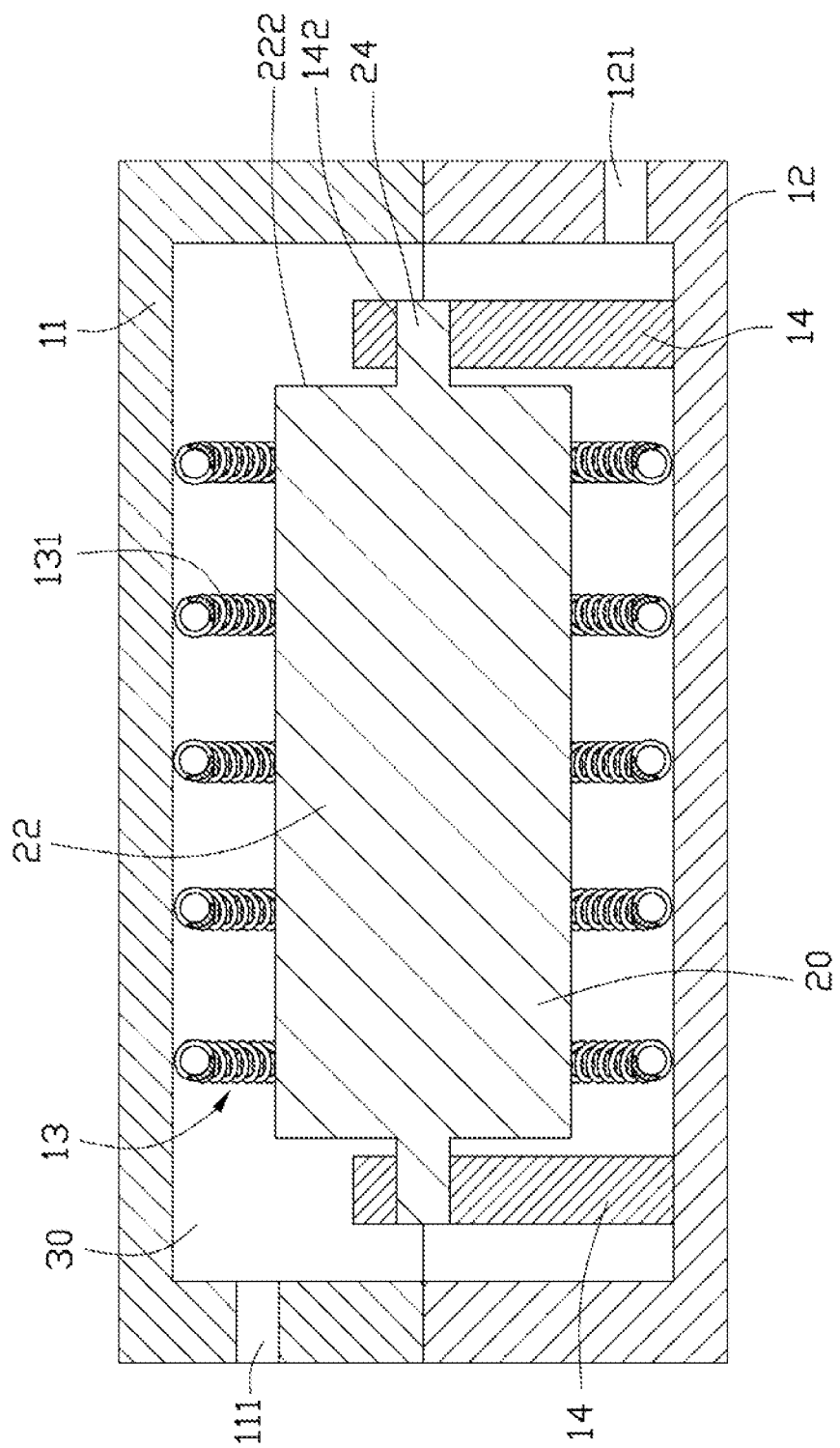
FIG. 2 is another sectional view of the film coating apparatus of FIG. 1.

Referring to FIGs. 1 and 2, a film coating apparatus 100, according to an exemplary embodiment, is shown. The film coating apparatus 100 coats a patterned roller 20 using an atomic layer deposition process. The patterned roller 20 includes a stainless steel cylinder 22 and two protrusions 24. The cylinder 22 has two circular ends 222 at opposite sides thereof, respectively, and a patterned copper layer is formed on a circumference of the cylinder 22. The two protrusions 24 extend from the circular ends 222, respectively.

The film coating apparatus 100 includes a deposition chamber 10, a heater 13, and two support members 14.

The deposition chamber 10 is substantially cuboid and includes an upper portion 11 and a bottom portion 12. The upper portion 11 is mounted to the bottom portion 12 in an airtight fashion. The upper portion 11 defines an inlet 111 in a sidewall thereof. The bottom portion 12 defines an outlet 121 in a sidewall thereof. The inlet 111 is misaligned with the outlet 121 so that gas can be diffused uniformly in the deposition chamber 10. The upper portion 11 and the bottom portion 12 cooperatively define a receiving space 30. The upper portion 11 is detachably mounted to the bottom portion 12. The two support members 14 extend from a bottom of the bottom portion 12. Each of the support members 14 defines a hole 142. The two protrusions 24 engage in the holes 142 so that the two support members 14 support the patterned roller 20 in place in the receiving space 30. The deposition chamber 10 further includes an inner upper surface 10a, an inner lower surface 10b, a first inner side surface 10c, and a second inner side surface 10d in the receiving space 30. The inner upper surface 10a, the first inner side surface 10c, the inner lower surface 10b, and the second inner side surface 10d are connected to each other end-to-end. The inner upper surface 10a faces the inner lower surface 10b. The first inner side surface 10c faces the second inner side surface 10d.

The heater 13 is received in the deposition chamber 10. The heater 13 includes a number of coiled filaments 131 each formed into a generally circular loop. That is, each of the filaments 131 is a closed ring and defines a through hole 131a in a middle of the closed ring. The filaments 131 are positioned in an array. A distance between two adjacent filaments 131 is substantially the same. The patterned roller 20 extends through all of the through holes 131a of the filaments 131. the filaments 131 surround the cylinder 22. Thus, the patterned roller 20 can be heated uniformly. In this embodiment, the filaments 131 are in contact with the inner side surface 10d.

When in use, the upper portion 11 is lifted off and the patterned roller 20 is placed in the receiving space 30 and is supported by the support members 14. Then, the upper portion 11 is mounted to the bottom portion 12 in an airtight fashion. The inlet 111 is sealed and a vacuum pump (not shown) is connected to the outlet 121 to achieve a predetermined vacuum, such as $10^{-1}$ torr in the deposition chamber 10. The filaments 131 are electrified to heat the patterned roller 20 in the receiving space 30 to a predetermined temperature, such as a decomposition temperature of a reaction gas. Then, the reaction gas is introduced into the deposition chamber 10 for a predetermined duration from the inlet 111. Finally, a protective film is coated on the patterned roller 20 and gas in the deposition chamber 10 is exhausted through the outlet 121. If the protective film is a metal oxide, the reaction gas includes an organic metallic gas and oxygen and the metal protective film may be harder than copper.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A film coating apparatus for coating a patterned roller using an atomic layer deposition process, comprising:

a deposition chamber defining an inlet and an outlet and comprising an inner upper surface, an inner lower surface, as first inner side surface, and a second inner side surface connected to each other end-to-end, the inner upper surface facing the inner lower surface, the first inner side surface facing the second inner side surface, the inlet being misaligned with the outlet; and a heater received in the deposition chamber, the heater comprising a plurality of coiled filaments each being a closed ring, the closed ring defining a through hole in a middle thereof, the filaments being spaced from each other with each filament surrounding the patterned roller, each filament being in contact with the inner upper surface, the first inner side surface, the inner lower surface, and the second inner side surface, the patterned roller extending through all of the through holes of the filaments, the filaments configured for heating the patterned roller.

2. The film coating apparatus of claim 1, wherein the deposition chamber comprises an upper portion and a bottom portion detachably mounted to the upper portion in an airtight fashion.

3. The film coating apparatus of claim 2, wherein the upper portion defines the inlet in a side wall thereof, and the bottom portion defines the outlet in a side wall thereof.

4. The film coating apparatus of claim 1, further comprising two support members configured for supporting the patterned roller in place in the deposition chamber.

5. The film coating apparatus of claim 4, wherein the patterned roller comprises a cylinder having two circular ends at opposite sides thereof and two protrusions extending from the two circular ends, respectively, each of the support members defines a hole, and the holes of the support members are configured for engagingly receiving the protrusions of the patterned roller, respectively.

\* \* \* \* \*